United States Patent [19]
Shinmura et al.

[11] Patent Number: 6,113,750
[45] Date of Patent: *Sep. 5, 2000

[54] METHOD OF FORMING THIN METAL FILMS

[75] Inventors: Toshiki Shinmura; Hiroaki Yamada; Toshiyuki Ohta, all of Tokyo, Japan

[73] Assignee: NEC Corporation, Tokyo, Japan

[ * ] Notice: This patent issued on a continued prosecution application filed under 37 CFR 1.53(d), and is subject to the twenty year patent term provisions of 35 U.S.C. 154(a)(2).

[21] Appl. No.: 08/752,930

[22] Filed: Nov. 20, 1996

[30] Foreign Application Priority Data

Jun. 10, 1996 [JP] Japan .................................. 8-146992

[51] Int. Cl.[7] .................................................. C23C 14/34
[52] U.S. Cl. ................................ 204/192.12; 204/298.12
[58] Field of Search ........................ 204/192.12, 298.11, 204/298.13, 298.12

[56] References Cited

U.S. PATENT DOCUMENTS

| | | | |
|---|---|---|---|
| 4,824,544 | 4/1989 | Mikalesen et al. ...................... | 204/298 |
| 5,529,670 | 6/1996 | Ryan et al. ......................... | 204/298.11 |
| 5,607,899 | 3/1997 | Yoshida et al. ..................... | 204/298.13 |
| 5,635,036 | 6/1997 | Demaray et al. ................... | 204/298.11 |
| 5,643,422 | 7/1997 | Yamada .............................. | 204/298.13 |
| 5,711,858 | 1/1998 | Kontra et al. ....................... | 204/298.11 |
| 5,772,860 | 6/1998 | Sawada et al. ..................... | 204/298.13 |

FOREIGN PATENT DOCUMENTS

| | | | |
|---|---|---|---|
| 1-116070 | 5/1989 | Japan .............................. | C23C 14/34 |
| 6-60391 | 8/1994 | Japan .............................. | C23C 14/34 |

*Primary Examiner*—Nam Nguyen
*Assistant Examiner*—Steven H. VerSteeg
*Attorney, Agent, or Firm*—Foley & Lardner

[57] ABSTRACT

Formation of metal thin films by collimate sputtering with high productivity and high bottom coverages. The bottom coverages by collimate sputtering are increased by using a target having a high sputtered-particle emission probability in the range of angles at which the collimator passage rate is high, without increasing the aspect ratio of the collimator, that is, without lowering the productivity.

7 Claims, 4 Drawing Sheets

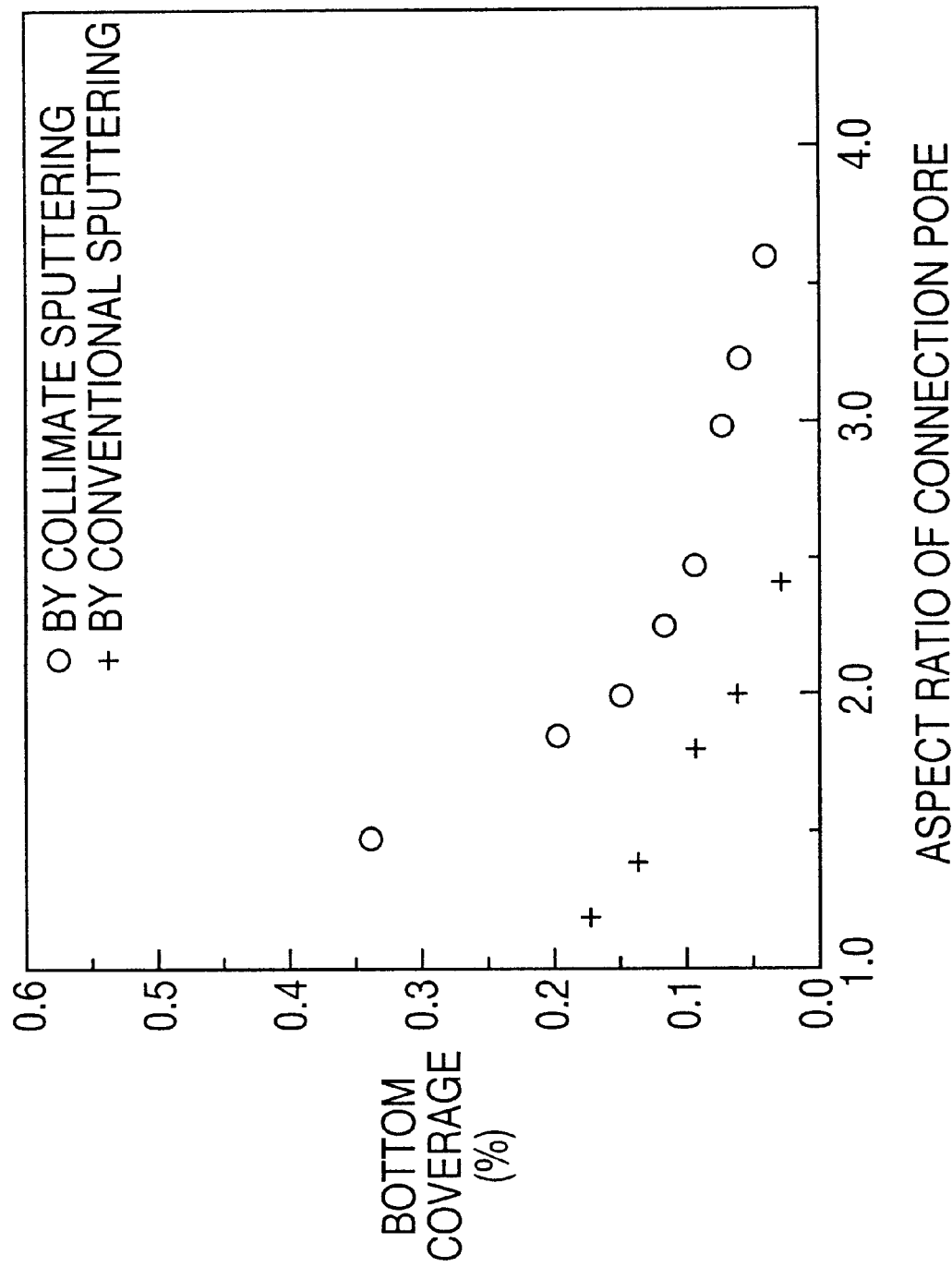

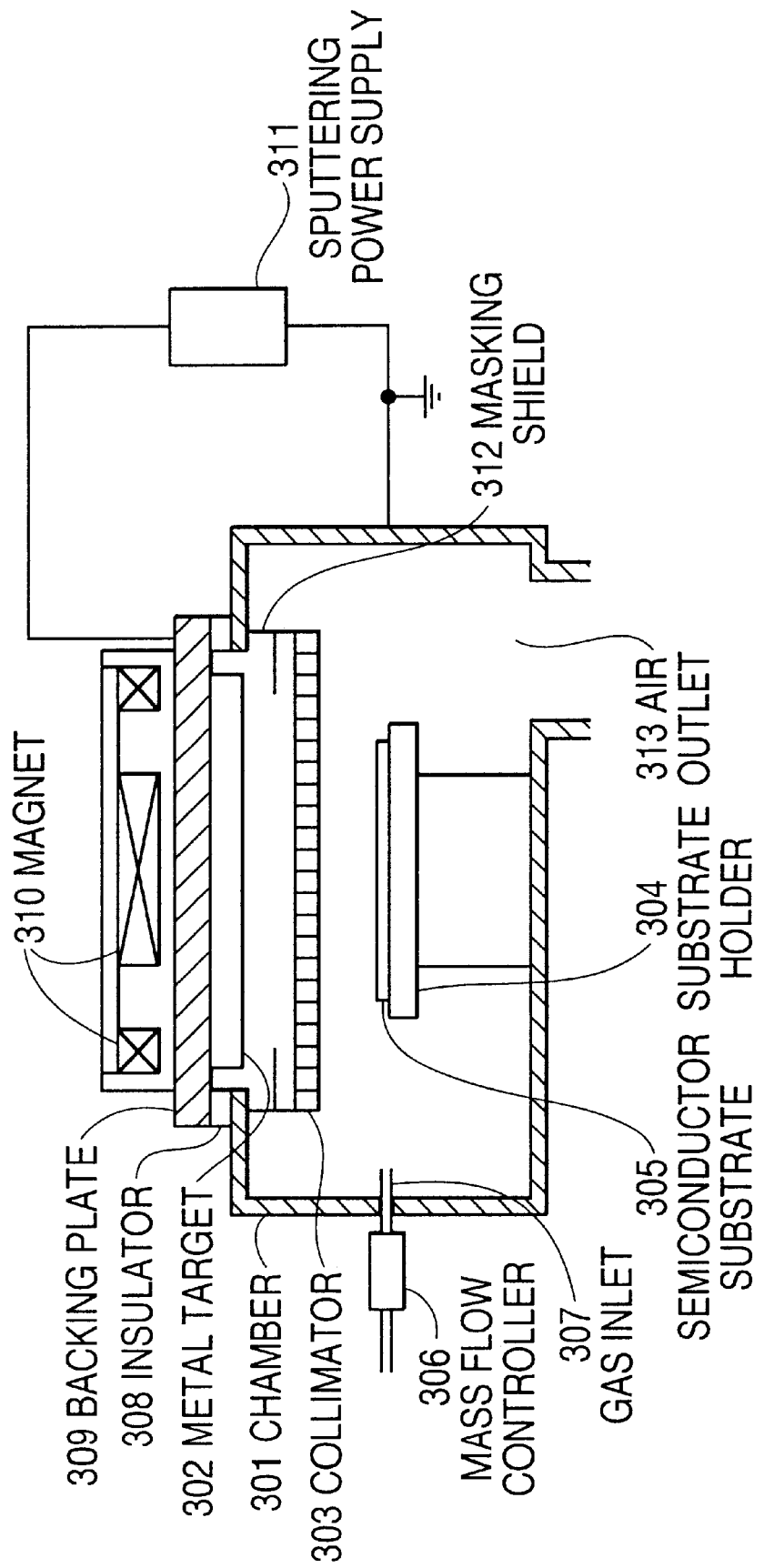

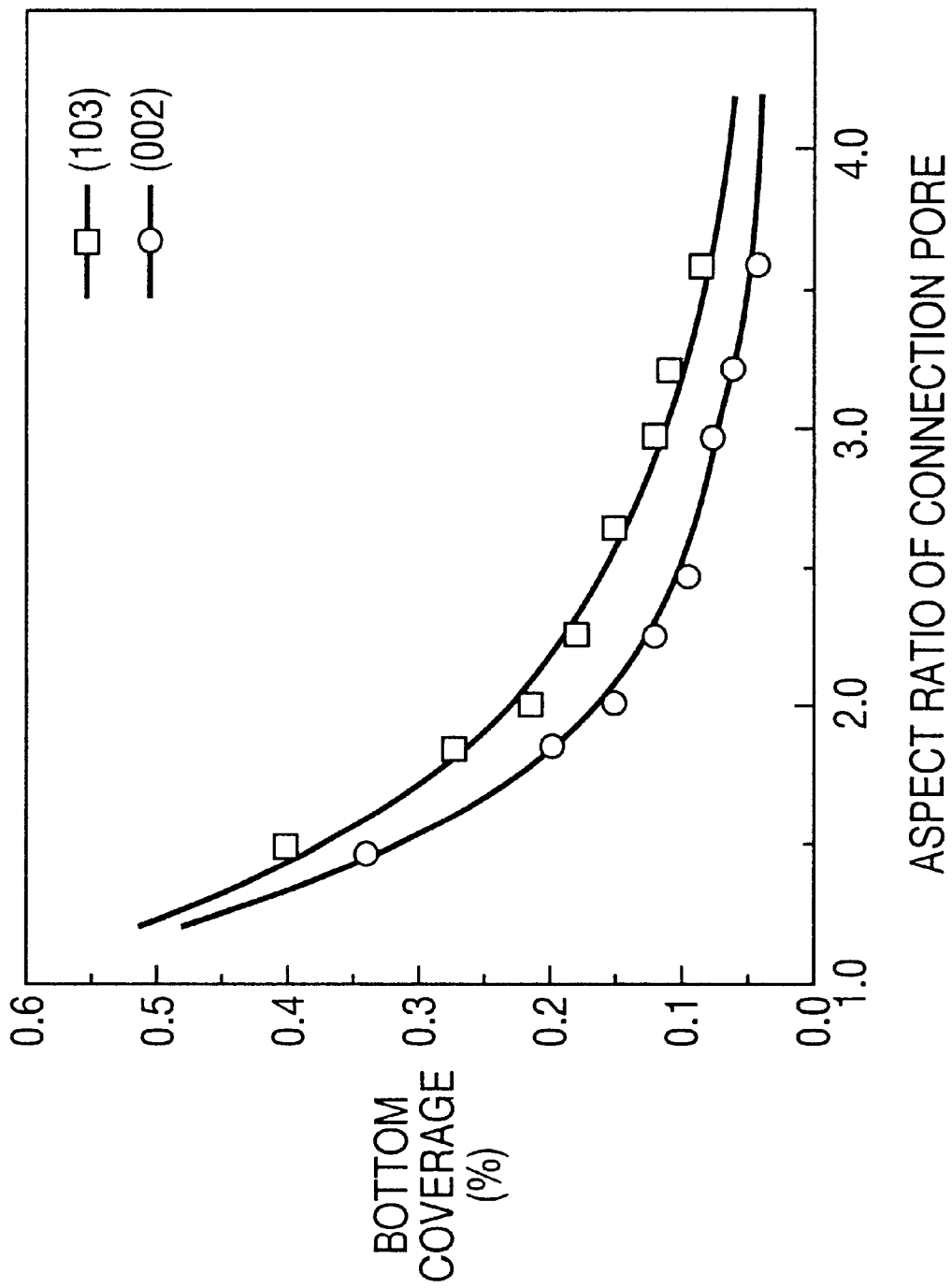

METHOD OF FORMING THIN METAL FILMS

BACKGROUND OF THE INVENTION

1. Field of the Invention

The present invention relates to a method of forming thin metal films, and more particularly to a method of forming thin metal films by collimate sputtering which is utilized in the process of fabricating semiconductor devices.

2. Description of the Related Art

Recently, the designs of semiconductor devices are becoming increasingly dense and three-dimensional. Accordingly, connection pores (contact holes) for establishing connection with the conductor regions formed on semiconductor substrates have greatly increasing aspect ratios (depth-to-aperture ratios of connection pores). As a result, in cases where the metal films are mainly formed of aluminum by conventional sputtering, the metal films along the sidewalls of connection pores discontinue halfway, thus failing to establish satisfactory electric connection.

Blanket WCVD is widely used as a technique which solves the problem, and which also infills the connection pores for planarization. This process requires provision of an underlying film to ensure a lower resistance of the contact with the conductor region, adhesion of a tungsten film, and a barrier against the $WF_6$ source gas. A tungsten film formed by sputtering is sometimes used as the underlying film, although this film is usually a laminate of a TiN film and a Ti film which does not need any special pretreatment for the film formation and has a small film stress. The Ti film is used as the lower layer which reduces the resistance of the contact with the conductor region formed on a semiconductor substrate, and the TiN film formed as the upper layer provides the barrier and adhesion properties.

The recent increase in aspect ratios of connection pores has become a great hindrance to the formation of the laminate of a TiN film and a Ti film by sputtering. As illustrated in FIG. 2, the coverage of the bottom of a connection pore (the bottom coverage, or the thickness of the film on the bottom of a connection pore/the thickness of the film on an insulating film) with a titanium film formed by the conventional sputtering is low, and steeply falls as the aspect ratio increases.

In addition, it is difficult to increase the thickness of a titanium film on the insulating film to 100 nm or greater. This is because increase in the thickness of the titanium film on the insulating film results in decrease in the aperture of the connection pore due to the titanium film, thus creating a bottleneck to infilling with tungsten. Furthermore, since titanium has a lower etching selection ratio than resists, increase in thickness of the titanium film makes it difficult to perform etching and formation of wiring patterns.

Since there is a 100-nm limit to the thickness of the titanium film on the insulating film, a bottom coverage of 10% or more is needed to ensure 10-nm film thickness required to satisfactorily lower and stabilize the resistance of the contact at the bottom of the connection pore. Nevertheless, as illustrated in FIG. 2, the bottom coverage by a titanium film using conventional sputtering is 10% or less when the aspect ratio is lower than 2. Therefore, it is difficult to ensure excellent contact properties when the connection pore has an aspect ratio of 2 or higher.

As means of solving the problem, collimate sputtering which uses a collimator, a porous plate, placed between the target and the semiconductor substrate has been suggested (see Japanese Examined Patent Application HEI 6-60391, and Japanese Unexamined Patent Application Disclosure HEI 1-116070, for example). In order to form a film, the collimator captures sputtered particles which are scattered far off the direction of the normal to the target (the direction of the normal to the collimator plate ±0.79 rads when the length-to-diameter ratio of each pore of the collimator plate is 1:1). This increases the ratio of the sputtered particles which reach the bottom of the connection pore with a high aspect ratio, and thus improves the bottom coverage.

FIG. 2 shows the aspect ratio-dependency of the bottom coverage when collimate sputtering is used. The aspect ratio of the collimator (the length-to-aperture ratio of each pore of the collimator) used in the case shown in the drawing is 1. The target used here is a titanium target with a high orientation rate for the (002) plane, which will be described in detail later.

The bottom coverage is approximately 15% when the aspect ratio of the contact hole is 2. Accordingly, even in the case of connection pores with high aspect ratios, it is possible to form titanium films having satisfactory thicknesses of 10 nm at the bottoms of the connection pores without increasing the thicknesses of the titanium films on the insulating films to 100 nm or greater.

In addition, use of a collimator with a higher aspect ratio allows only the sputtered particles near the direction of the normal to the semiconductor substrate to strike the semiconductor substrate, and this results in a higher bottom coverage which allows for contact holes with higher aspect ratios.

A problem of the prior art techniques is that the conventional collimate sputtering cannot achieve both an increase in the productivity, and the necessary degree of bottom coverage to provide contact holes with aspect ratios of 2.5 or higher, with excellent electrical characteristics.

The reasons are as follows.

When the aspect ratio of the collimator is 1, the bottom coverage for a connection pore with an aspect ratio of 2.5 is 10% or less, as illustrated in FIG. 2. As described in the section "Description of the Prior Art", it is impossible to ensure a satisfactory titanium film thickness at the bottom of the connection pore in the above case.

Collimate sputtering allows the bottom coverage to be easily increased by increasing the aspect ratio of the collimator, since only the particles are allowed to pass through. However, this also results in more of the sputtered particles being captured by the collimator. For example, when the aspect ratio of the collimator is increased from 1 to 1.5, the ratio of the sputtered particles which reach the substrate decreases to ½. As a result, the film forming rate per unit power decreases to ½, and the frequency of replacement of the target and the collimator is doubled.

The conventional collimate sputtering fails to provide satisfactorily high bottom coverages as compared with the aspect ratio of the collimator for the following reasons.

The titanium targets used for the collimate sputtering of the prior art are the same as the targets used for the conventional sputtering (sputtering without use of a collimator). In other words, the targets are not particularly designed so as to match collimate sputtering. The titanium targets have a crystal orientation wherein the sputtering surfaces are greatly orientated in the (002) plane.

The collimator passage rate of the sputtered particles depends on the angle of the sputtered particles incident on the collimator plate. Assuming that the direction of the normal to the collimator plate is the direction of 0 rads, the passage rate of the sputtered particles gradually decreases until the angle reaches a limit passage angle (0.79 rads when the collimator has an aspect ratio of 1). When the collimator has an aspect ratio of 1, the passage rate for angles around 0.25 rads is approximately 50% that for the direction of 0 rads. When the aspect ratio of the collimator is 1, the direction which allows the sputtered particles to pass through ranges from 0 to 0.25 rads. Since the target plate and the collimator plate are placed in parallel in a sputtering chamber, mainly particles emitted from the target with angles within the above range pass through the collimator.

As mentioned above, the titanium target used in the conventional collimate sputtering has a sputtering surface greatly orientated in the (002) plane. The emission angle distribution of the sputtered particles when the sputtering surface is in the (002) plane is as illustrated in FIG. 1. The drawing illustrates the results of a simulation performed by the inventors. The direction of the normal to the target is defined to be the direction of 0 rads also in the drawing. The distribution of angles of emission from the (002) plane does not exhibit a particularly high emission probability for the direction of 0 rads to 0.25 rads, in which the sputtered particles have a high passage rate for the collimator with an aspect ratio of 1:1. For this reason, a satisfactorily high bottom coverage is not achieved.

SUMMARY OF THE INVENTION

It is an object of the present invention to improve the bottom coverage by a titanium film by collimate sputtering for an extended range of the aspect ratio of a connection pore which allows formation of an excellent contact, without lowering the productivity.

BRIEF DESCRIPTION OF THE DRAWINGS

FIG. 2 is an illustration of the aspect ratio-dependency of the bottom coverage by a titanium film;

FIG. 3 is a cross sectional view of a sputtering chamber with a target according to the present invention; and FIG. 4 is an illustration of the dependency of the bottom coverage on the crystal surface of a target.

DETAILED DESCRIPTION

Figure 1:
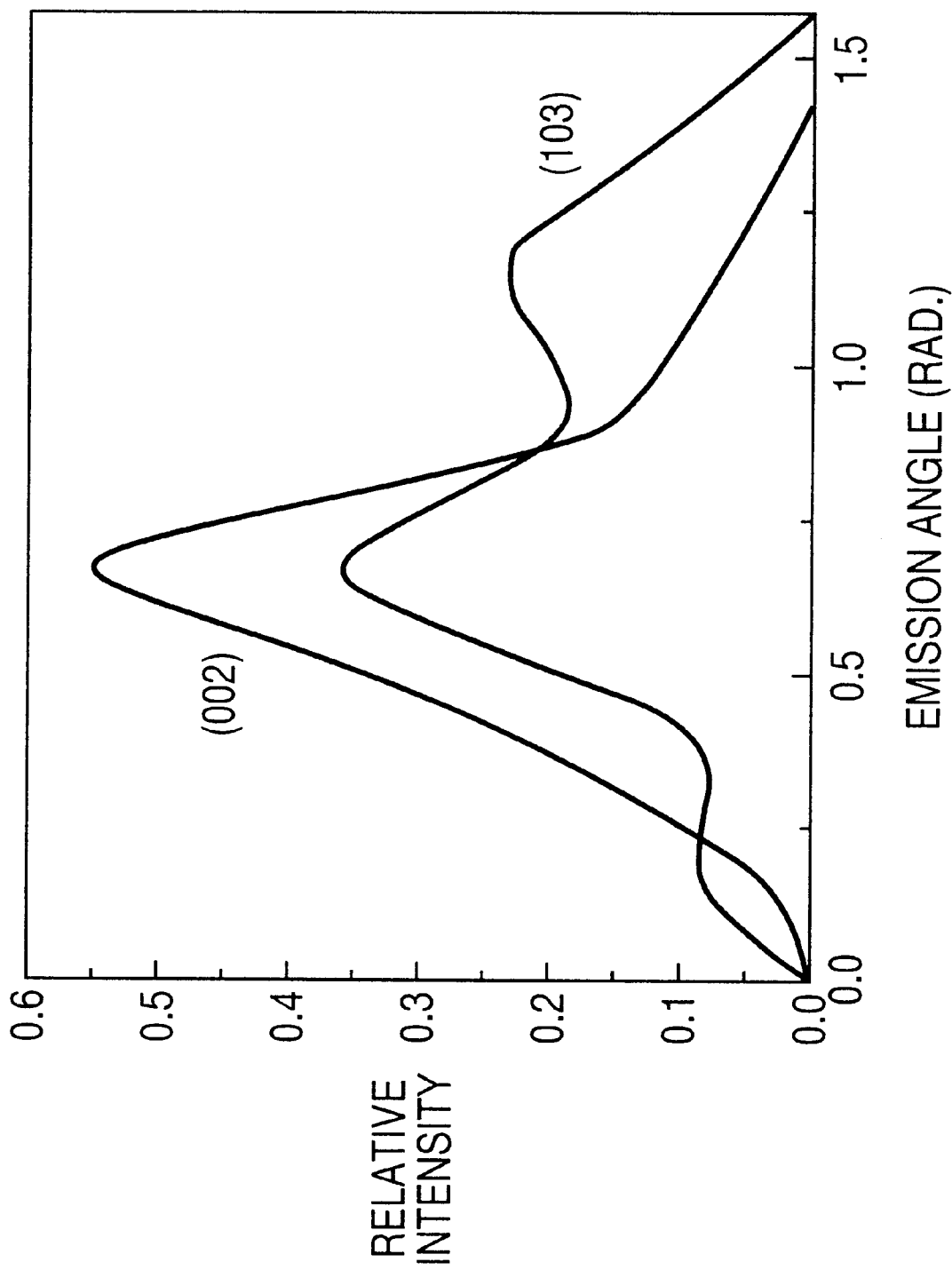
FIG. 1 is an illustration of the emission angle distribution of sputtered particles.

The present invention is a method of forming a thin metal film which comprises placing a collimator which imposes limitations on the direction of movement of the sputtered particles, between a metal target and a substrate holder provided in a chamber, and forming a thin metal film on a semiconductor substrate held by the substrate holder (a collimate sputtering method), and which is characterized in that the metal target used is a target having a high emission probability in the range of angles at which the sputtered particles have a high collimator passage rate.

The present invention is also characterized in that the collimator has an aspect ratio on the order of 1, the metal target is composed of titanium, and the sputtering surface of the target is in the (103) plane.

The use of the target with a high emission probability in the range of angles at which the sputtered particles have a high collimator passage rate in collimate sputtering results increases the efficiency of the collimator in controlling the direction of movement of the sputtered particles. This in turn increases the bottom coverage without increasing the aspect ratio of the collimator. Since the aspect ratio of the collimator is not changed, the productivity is not reduced.

DETAILED DESCRIPTION OF THE PREFERRED EMBODIMENTS

The present invention will now be described in detail with reference to the drawings.

The titanium target with a high emission probability in the range of angles at which the sputtered particles have a high collimator passage rate, which is used according to the present invention, may be prepared as described below.

First, a single-crystal titanium bulk material is prepared. The single-crystal bulk material may be in the form of a rod approximately 5 cm in diameter. The crystal surface is then inspected by a technique such as X-ray diffraction, and the single-crystal bulk material is cut into plates of even thickness, with the surfaces lying in the (103) plane. These plates are trimmed to square plates with 4-cm sides. The square plates of the single-crystal titanium are stacked on a backing plate (target backboard) without leaving clearances. An aluminum alloy is preferable as the backing plate material, since the alloy has a high thermal conductivity which allows efficient dissipation of the heat generated by the sputtering, and is light and easy to handle.

Thereafter, junction of the backing plate and the titanium plate with the sputtering surface in the (103) plane, and of the titanium plates is performed by diffused junction. Collimate sputtering sometimes uses power of 15 kW or greater for forming films, in which the target may often peel off due to the heat during the process of sputtering when the target is prepared by metal bonding. Therefore, diffused junction must be used to join the backing plate and the titanium plates.

According to the method described above, the main surface of the target (the sputtering surface of the target) is completely in the (103) plane. This process allows advanced control of the crystal surface on the one hand, but complicates the preparation method on the other hand.

The effect of the present invention may be produced even when the single crystal is not used, and the sputtering surface is not completely in the (103) plane. All the conventionally used titanium targets are polycrystalline targets, and even with polycrystalline titanium targets, the effect of the present invention may be produced by increasing the rate of orientation of the sputtering surface in the (103) plane.

The rate of orientation of the sputtering surface of a polycrystalline titanium target in the (103) plane may be increased by the following method. The process of preparing a titanium target usually involves the step of rolling a titanium ingot into a plate and the subsequent step of thermally treating the titanium for recrystallization. The temperature during the thermal treatment in the process of preparing a titanium target usually is rather higher than the recrystallization temperature of titanium. The rate of orientation of the sputtering surface in the (103) plane may be increased by setting the temperature close to the recrystallization temperature to cause the recrystallization at a lower temperature than usual. This allows the rate of orientation of the sputtering surface in the (103) plane to increase to approximately 60%.

FIG. 3 is a cross sectional view of a sputtering apparatus for explaining the present invention. Placed in a chamber 301 are a collimator 303, a substrate holder 304, a mass flow controller 306, a gas inlet 307, an insulator 308, a backing plate (target backboard) 309, a magnet 310, a masking shield 312, an air outlet 313, and a titanium target 302 with the sputtering surface in the (103) plane according to the present invention. The collimator used is one having an aspect ratio of 1. The semiconductor substrate holder 304 holds a semiconductor substrate 305. A sputtering power supply 311 is connected as illustrated in the drawing. The distance between the titanium target 302 and the semiconductor substrate 305 is designed to be approximately 100 mm, and the distance between the target 302 and the collimator 303, approximately 60 mm.

The chamber is constructed in the same manner as in the case of the conventional collimate sputtering, except that a titanium target with the sputtering surface in the (103) place is used as the target.

An explanation will now be given regrading the operation of the chamber 301 in FIG. 3. The effect of oxygen is prevented by maintaining the basic pressure (the pressure except during the process of sputtering) in the chamber 301 on the order of $10^{-8}$ Torr with a cryopump.

Ar as the sputtering gas is supplied to the chamber via the gas inlet 307 during the process of sputtering. The Ar pressure in the chamber is set by adjusting the Ar flow by the mass flow controller 306. The Ar pressure in the chamber 301 is set to 0.3–3 mTorr. The 0.3-mTorr lower limit is set, since glow discharge is hard to be caused, and thus the sputtering is difficult to achieve when the pressure is 0.3 mTorr or less. The 3-mTorr upper limit is set for the following reason. The average free travel of the sputtered particles is on the order of 3 cm when the pressure is 3 mTorr. Therefore, when the pressure is 3 mTorr or higher, the average free travel exceeds the distance between the collimator and the semiconductor substrate, and thus the directional properties of the sputtered particles imparted by the collimator are impaired to greatly reduce the effect of the collimator.

After the pressure in the chamber has been stabilized, a voltage on the order of 500 V is applied by the sputtering power supply 311. This causes glow discharge to initiate sputtering. A film of titanium is formed on the semiconductor substrate 305 in this way.

The titanium target used in collimate sputtering according to the present invention is one with the sputtering surface in the (103) plane. The emission angle distributions of the sputtered particles when the sputtering surface is in the (002) plane or in the (003) plane were as illustrated in FIG. 1 which shows the results of a simulation.

It appears by inspection over the entire angle range that more of the sputtered particles are emitted toward the vicinity of the direction of the normal to the target (the direction of 0 rads) when the surface of the target is in the (002) plane according to the prior art. When the surface is in the (003) plane, the second peak is observed when the angle is around 1.4 rads at which, however, the sputtered particles have a low emission probability when the surface is in the (002) plane.

With a collimator having an aspect ratio of 1, however, a higher emission probability is observed for the case where the surface is in the (103) plane than for the case where the surface is in the (002) plane when the angle ranges from 0 to 0.25 rads at which a high collimator passage rate is observed.

When the sputtering surface is in the (103) plane, since collimate sputtering exhibits a high emission probability in the range of angles at which the collimator passage rate is high, a higher bottom coverage is achieved than in the case where the sputtering surface is in the (002) plane. The performance is illustrated in FIG. 4. In the case illustrated, the aspect ratio of the collimator is 1; the solid line is the trace of a simulation, and the points reflect the measured values. A bottom coverage of 10% or higher is achieved even when the aspect ratio is 3. In other words, when the sputtering surface is in the (103) plane, a satisfactory contact may be formed even in the case of a contact hole with an aspect ratio of 3, without reducing the productivity.

The aspect ratio of the collimator used in the above embodiment was 1. There is no need to strictly limit the aspect ratio of the collimator to 1. The effect of the present invention may be produced when the aspect ratio of the collimator is on the order of 0–8 to 1.3, for the same reason as mentioned above.

This means that the bottom coverage may be improved without increasing the aspect ratio of the collimator.

In the embodiment above, a target with an increased ratio of orientation of the sputtering surface in the (103) plane or with the sputtering surface 100% orientated in the (103) plane through the use of a single crystal was used as the target which provides a high sputtered-particle emission rate in the range of angles at which a high collimator passage rate is achieved.

The target available for use according to the present invention must not be restricted to the one with the sputtering surface in the (103) plane. All the targets which exhibit high sputtered-particle emission probabilities in the range of angles for high collimator passage rates, can produce the effect of the present invention. It has been revealed in simulation that even when the sputtering surface is in the (110) plane, the target exhibits a somewhat higher emission probability in the range of angles of 0 to 0.25 rads. than in the case where the sputtering surface is in the (002) plane.

When the sputtering surface is in the (103) plane or in the (110) plane, since the emission probability is high in the range of angles of 0 to 0.25 rads, collimators with aspect ratios on the order of 1 produced the effect. It is also to be noted that when other targets which exhibit high emission probabilities in different ranges of angles are used, the range of the aspect ratios which produce the excellent effect naturally changes.

Further, the embodiment described above is an example of the present invention wherein titanium is used as the constituent element of the target. The effect of the present invention may be produced even when another metal is used. More specifically, all the targets which exhibit high sputtered-particle emission probabilities in the range of angles for high collimator passage rates may increase the bottom coverages without increasing the aspect ratios of the collimator, that is, without lowering the productivity, regardless of the types of elements which compose the targets.

The present invention produces the effect of increasing the bottom coverages by titanium films by collimate sputtering, and extending the range of aspect ratios which provide excellent electrical characteristics, without lowering the productivity.

This effect is produced, since sputtering targets with high emission probabilities in the range of angles for high collimator passage rates of sputtered particles are used to increase the bottom coverages, without depending on increase in the aspect ratios of the collimator which results in lower productivity.

What is claimed is:

1. A method of forming a thin metal film comprising:
   placing a metal target for generating sputtered particles in opposition to a substrate holder in a chamber, the target having a sputtering surface facing the substrate holder, crystal lattices of the metal target at a sputtering surface of the metal target being oriented primarily with (103) planes parallel to the sputtering surface;

placing a collimator which imposes limitations on direction of movement of the sputtered particles, between the metal target and the substrate holder; and forming a thin metal film on a semiconductor substrate held by said substrate holder.

2. The method as claimed in claim 1, wherein said target has high sputtered particle emission probability in a range of angles relative to a direction of a normal to the target ±0.25 rads.

3. The method as claimed in claim 1, wherein said collimator has an aspect ratio on the order of 1, and said metal target is composed of polycrystalline titanium.

4. The method as claimed in claim 1, wherein gas pressure during a process of sputtering is 0.3–3 mTorr.

5. A method of forming a thin metal film, comprising:

placing a metal target for generating sputtered particles in opposition to a substrate holder in a chamber, the target having a sputtering surface facing the substrate holder, crystal lattices of the metal target at a sputtering surface of the metal target being oriented primarily with (103) planes parallel to the sputtering surface;

placing a collimator which imposes limitations on direction of movement of the sputtered particles, between the metal target and the substrate holder; and forming a thin metal film on a semiconductor substrate held by said substrate holder, said metal target is composed of single-crystal titanium.

6. The method as claimed in claim 3, wherein said collimator has an aspect ratio of approximately 1.

7. A method of forming a thin metal film comprising:

placing a metal target for generating sputtered particles in opposition to a substrate holder in a chamber, the target having a sputtering surface facing the substrate holder, crystal lattices of the metal target at a sputtering surface of the metal target being oriented primarily with (103) planes parallel to the sputtering surface;

placing a collimator which imposes limitations on direction of movement of the sputtered particles, between the metal target and the substrate holder; and forming a thin metal film on a semiconductor substrate held by said substrate holder, wherein said metal target is formed by the process of:

forming a titanium plate, and thermally treating the titanium plate at approximately the recrystallization temperature.

* * * * *